United States Patent [19]

Fisher

[11] Patent Number: 4,851,693
[45] Date of Patent: Jul. 25, 1989

[54] COMPENSATED SCAN WAVE FORM GENERATOR FOR ION IMPLANTATION EQUIPMENT

[75] Inventor: Peter A. Fisher, Hamilton, Mass.
[73] Assignee: Varian Associates, Inc., Palo Alto, Calif.
[21] Appl. No.: 202,748
[22] Filed: Jun. 3, 1988
[51] Int. Cl.$^4$ ........................................... H01J 31/302
[52] U.S. Cl. .................................. 250/492.3; 250/398; 250/396 R
[58] Field of Search ................ 250/492.21, 492.2, 398, 250/396 R

[56] References Cited

U.S. PATENT DOCUMENTS

| | | | |
|---|---|---|---|
| 3,688,203 | 8/1972 | Harrison | 328/229 |
| 3,932,817 | 1/1976 | Rogers | 328/128 |
| 4,013,262 | 3/1977 | Schott, Jr. et al. | 250/492 A |
| 4,144,579 | 3/1979 | Nossen et al. | 364/607 |
| 4,283,631 | 8/1981 | Turner | 250/492 B |
| 4,593,200 | 6/1986 | Maguire, III | 250/492.2 |

OTHER PUBLICATIONS

Turner, "Improved Uniformity of Ion Implanted Dose by a Compensated Scan Pattern Generator", Report No. 8, Varian Semiconductor Equipment Group.
Keller, "Beam Scanning-Electrostatic, Radiation Effects", 1979, vol. 44, pp. 71-80.
Zhigarev, "Electron Optics and Electron-Beam Devices", Chap. 5, Deflection Systems, pp. 316-327, Mir Publishers, Moscow, 1975; Chap. 1, pp. 16-19.
Frenkel, "Electrostatic Deflection Plates for Cathode-Ray Tubes", Journal of Research of National Bureau of Standards, C. Engineering and Instrumentation, vol. 64C, No. 2, Apr.-Jun. 1960.
Liebl, "Ion Optics for Surface Analysis", Inst. Phys. Conf. Ser. No. 38, 1978, Chapter 6, pp. 266-275.
Rogers, "Optimal Selection of Sweep Frequencies in Ion Implantation Systems with X-Y Scanning", Nuclear Instruments and Methods 189, 1981, pp. 305-310.
Analog Devices, "Multiplier Application Guide", pp. 33, 34, 1978.

Primary Examiner—Jack I. Berman
Attorney, Agent, or Firm—Stanley Z. Cole; Terrence E. Dooher

[57] ABSTRACT

A scan controller for an ion implantation system includes a compensation circuit for generating a scanning signal from a triangle voltage signal. The scanning signal causes an ion beam to be deflected so that, in the variety of geometries describing the orientation of the target in the implantation system, the position of the intersection of the ion beam with the planar target surface changes linearly with time. In one embodiment the scanning signal has the form $v(t) = -d - e/(t+c)$. In other embodiments the compensation circuit approximates the above function by means of polynomials.

7 Claims, 6 Drawing Sheets

COMPENSATED SCAN WAVE FORM GENERATOR FOR ION IMPLANTATION EQUIPMENT

FIELD OF THE INVENTION

The present invention relates to the field of control of electrostatically scanned ion beams in an ion implantation system, and in particular to a scan controller for generating a scan signal which improves the uniformity of the doping distribution resulting from the scanned beam.

BACKGROUND OF THE INVENTION

The irradiation of target metals or semiconductor materials by an ion beam provides a process for effecting the doping of such materials in a controlled and rapid manner. One method of accomplishing this process, known as ion implantation, involves electrostatically scanning (deflecting) an ion beam of controlled intensity in a selected two dimensional pattern across the surface of a target. Uniformity of the resulting doping concentration in the target is typically a primary objective of the scanning system.

In order to achieve uniform doping, it is generally desirable to electrostatically deflect (scan) the beam so that the position of the intersection of the ion beam with the planar surface of a target changes linearly with time, i.e., so that the speed of the point of intersection on the target surface is constant. The appropriate scan signal to achieve the desired uniform doping is typically generated by modifying (compensating) a triangle wave form.

One prior art compensation method and apparatus is described in Turner, U.S. Pat. No. 4,283,631 and assigned to the assignee of the present invention Another, compensation technique is described in McGuire, U.S. Pat. No. 4,593,200, which will be more fully discussed below.

SUMMARY OF THE INVENTION

An apparatus for scanning an ion beam in an ion implantation system is provided which includes means for generating a scan voltage of the form $v(t) = -d - e/(t+c)$ from a triangle voltage signal, where d and c are constants and e is a non-zero constant. The scan voltage is supplied to a pair of deflection electrodes which scan the beam across the target. The scan voltage so generated causes the beam to be electrostatically deflected so that in a variety of geometries describing the orientation of the target with respect to the deflection system, the position of the intersection of the ion beam with a planar target surface changes linearly with time.

In two embodiments of the scanning apparatus, the means for generating a scan voltage provides a polynomial approximation to the above voltage form. Means are provided for independently adjusting the magnitude of the coefficients of the polynomial.

The scanning apparatus of the invention is typically employed in a two dimensional scanning system having a first pair of scanning plates and a second pair of scanning plates wherein the electric field generated by the pairs of plates are orthogonal. The scanning apparatus of the present invention may be employed with either or both pairs of deflection electrodes depending on the orientation of the target being scanned with respect to the scanning system.

To a first order approximation, the above scanning apparatus provides constant velocity of the point of intersection of the scanned ion beam with the planar surface of the target.

A method for scanning an ion beam is also described which includes the steps of generating a voltage signal having a triangle wave form and deriving from the triangle voltage signal a scan voltage signal having the form $v(t) = -d - e/(t+c)$, where d and c are constants and e is a non-zero constant and then supplying this scan voltage to a pair of electrodes for deflecting an ion beam. These and other advantages of the invention will be apparent from the following description of the drawings and the detailed description of the invention.

DETAILED DESCRIPTION OF THE INVENTION

Figure 1:
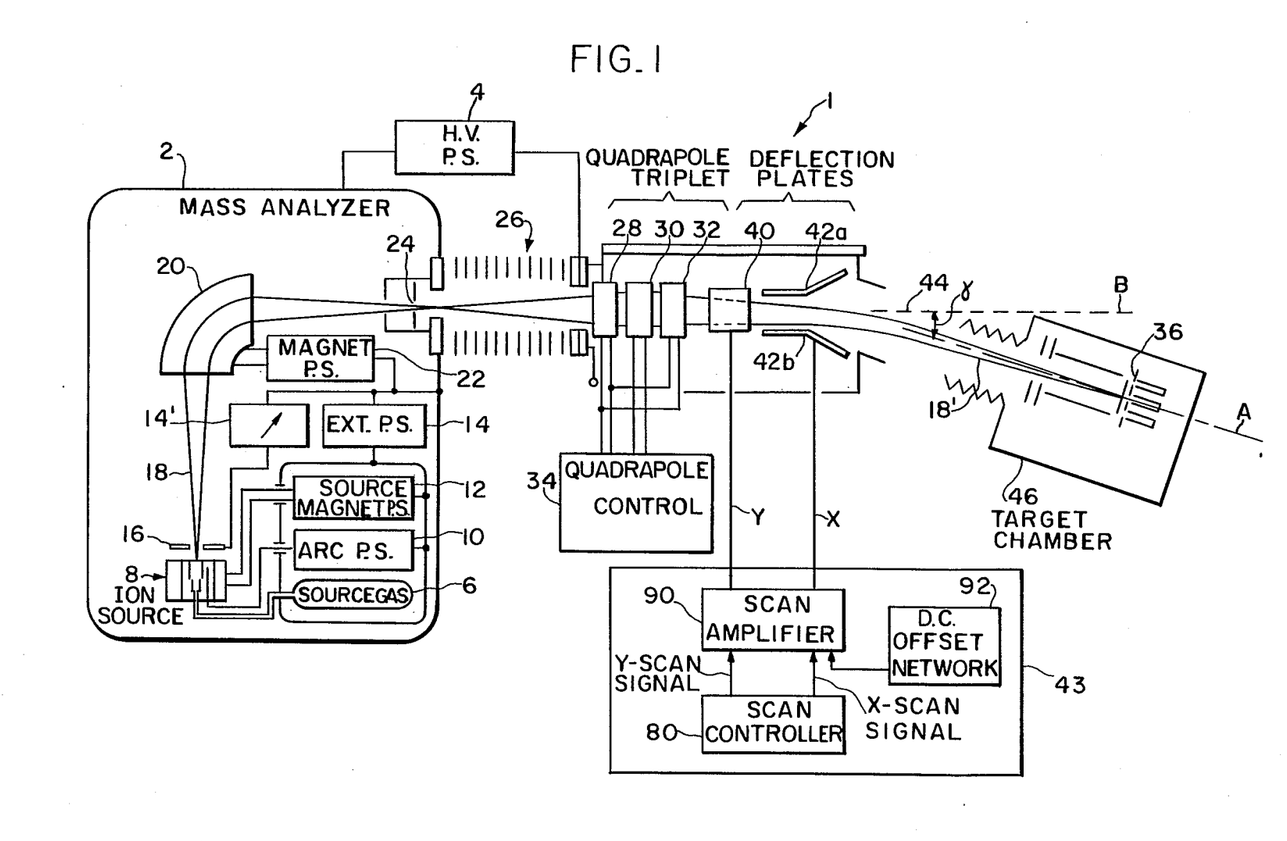
FIG. 1 shows scanning system 43 of the present invention in the context of ion implantation system 1.

FIG. 1 shows the scanning system 43 of the present invention in the context of an ion implantation system 1. Ion implantation system 1 includes high voltage terminal 2 which in operation is held at high potential relative to ground by high voltage power supply 4. Terminal 2 houses the apparatus required to form a beam of ions of desired species. In common practice a gaseous feed stock of desired species is employed. To this end, a source gas produced from gas handling system 6 is directed to ion source 8. A typical ion source will require a power supply 10 to sustain an ionizing discharge, power supply 12 to impose an axial magnetic field across the discharge region, and extraction power supply 14 and vernier 14' cooperating with extraction electrode 16 to shape the electric field at the aperture of the source for removal of a well defined high current ion beam. The present invention may be employed with a wide variety of ion sources. See, for example, L. Valyi, "Atom and ion sources," Wiley-Interscience, 1978.

Beam 18 diverging from ion source 8 is momentum analyzed by analyzer magnet 20. Power supply 22 energizes magnet 20. The analyzed beam passes through analyzer exit slit 24 and then to accelerator tube 26 where it encounters a carefully designed field gradient from high voltage terminal 2 to ground potential. As is well known in the art, optical elements, such as a quadrapole triplet 28, 30, 32, and associated control system 34, may be employed to produce a spatial-energy focus at a desired image plane. Scanning voltages applied to two sets of electrostatic deflection plates 40, and 42a and 42b, arbitrarily labeled y and x respectively, serve to direct the beam over the desired area of the image plane. The electric field generated by plates 40 is orthogonal to the electric field generated by plates 42a and 42b. The wave forms applied to the respective deflection plates and their synchronization to form the appropriate scanning program is accomplished by scanning system 43.

Scanning system 43 includes scan controller 80, scan amplifier 90 and typically DC offset network 92. Usually, a fixed offset voltage from network 92 is provided to scan plates 42a and 42b via scan amplifier 90 so that the quiescent (i.e., before the application of scanning voltages) beam is deflected from beam axis B through a fixed angle $\gamma$ (typically 7°) sufficient to completely separate neutral beam 44 (arising from charge-exchange collisions with residual gases) from the charged beam 18'. Axis A is the axis of the quiescent offset beam 18'. The x-scan (deflection) voltage signal generated by scan controller 80 is superimposed on the offset voltage.

Target chamber 46 contains beam defining apertures, beam monitoring and integrating apparatus 36 and equipment (not shown) for introducing the wafer substrate into the vacuum system and aligning the substrate with respect to the target plane.

Vacuum pumping apparatus and the vacuum envelope of the system is not shown, but it will be appreciated by those skilled in the art that the entire region traversed by the beam is maintained at high vacuum.

In a commercial context it is extremely important that a high degree of uniformity of ion dosage be maintained over the surface of the target wafer and that the time required to implant a wafer be short.

Figure 2:
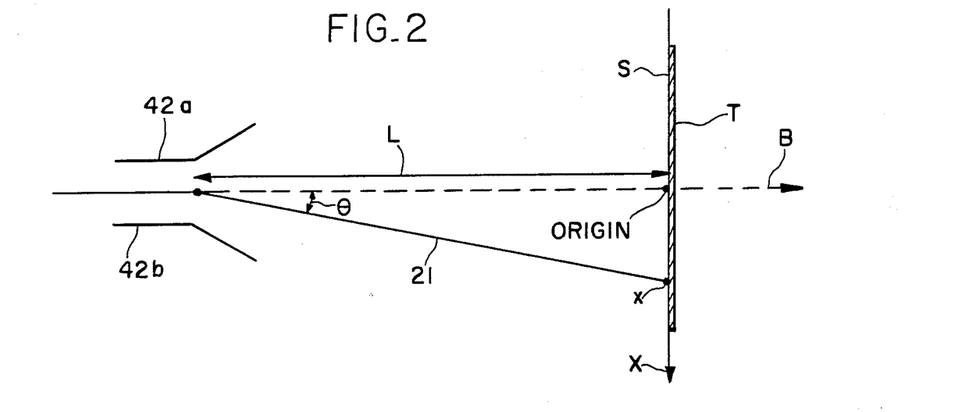
FIG. 2 shows an ion beam 21 deflected through angle $\Theta$ toward target T by voltage $v_x$ applied to x-scan plates 42a and 42b.

FIG. 2 shows an ion beam 21 deflected through angle $\Theta$ by voltage $v_x$ applied to x-scan plates 42a and 42b. The B axis is assumed to pass through the center of the wafer. In the analysis of FIG. 2 which follows, the offset voltage is assumed to be 0, and the scanning voltage $v_x$ is applied to the x-scan plates The deflected beam 21 intersects the X-axis at x. Target wafer T is perpendicular to beam axis B, and the X-axis lies on planar surface S of target T. The Y-axis (not shown in FIG. 2), is orthogonal to the X-axis and the beam axis B and passes through their intersection.

As is well known in the prior art, and as way be seen from FIG. 2, $$\tan\Theta = x/L \quad (1)$$

where L is the distance from the center of the scan plates to target T.

It is also well known in the prior art that to a first order approximation $$v_x = k_0 \tan\Theta \quad (2)$$

where $k_0$ is a constant. See, for example, A. Zhigarev, "Electron Optics and Electron-Beam Devices" (translated from the Russian by N. Utkin) Mir Publishers, Moscow, Chapter 5, Deflection Systems, pp. 316–327, which are incorporated herein by reference. Equation (2) does not take into consideration non-linear effects due to fringing fields.

It follows from equations (1) and (2) that $$x = Lv_x/k_0. \quad (3)$$

In other words, the x-coordinate of the deflected ion beam varies linearly with deflection voltage $v_x$. Thus, the speed of the point of intersection of the ion beam along the X-axis, $dx/dt = (L/k_0)dv_x/dt$. Hence, if over some time interval $v_x(t) = \alpha t$ where $\alpha$ is a constant, as is the case over a portion of a triangle wave form, then $dx/dt = L\alpha/k_0$ is also constant over this interval.

Thus for the configuration shown in FIG. 2, no compensation, to a first order approximation, is necessary. While this relationship is well known in the prior art, some scan controllers apparently have been designed based on the supposition that an uncompensated triangle voltage produces constant angular speed $d\Theta/dt$ over a time interval where $dv/dt = \alpha$ instead of constant speed of the point of intersection of the ion beam with a target normal to the quiescent beam. See McGuire, III, U.S. Pat. No. 4,593,200. Such controllers would not provide accurate results in certain system configurations.

Figure 3:
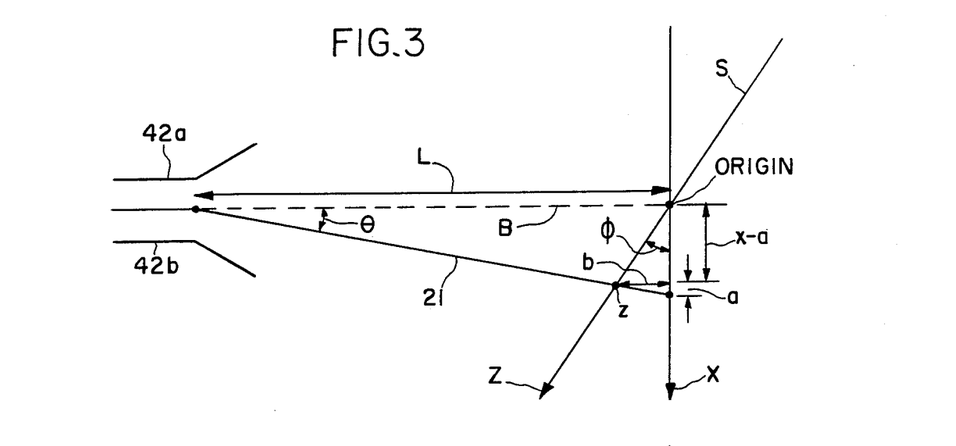
FIG. 3 shows surface S of target T tilted (rotated) by a fixed angle $\phi$.

In many applications, it is desirable that the surface S of target T be tilted at a fixed angle $\phi$ with respect to beam axis B (i.e., rotated by a fixed angle $\phi$ about the Y-axis). FIG. 3 shows surface S rotated through a fixed angle $\phi$ about the Y-axis. (Target T is not shown to clarify the diagram.) The center of the target is assumed to be at the origin. Typically, $\phi$ is some small tilt angle less than 20°, but $\phi$ is shown as a substantial angle in FIG. 3 for purposes of clarity. $\phi$ can also take on negative values in some configurations in which case the derivation below is valid provided the compensated wave form is inverted by an inverter (not shown). In order to assure uniform implant of the target, it is desirable that the deflection voltage applied to plates 42a and 42b cause the point of intersection of deflected beam 21 to travel with constant velocity along the Z-axis (the Z-axis is in the plane defined by the X- and B-axes and runs along surface S. The required form of the deflection voltage to achieve the constant velocity is derived below.

It follows from FIG. 3 that $$\tan\Theta = x/L \quad (1)$$

$$\tan\Theta = a/b \quad (4)$$

where b is the length of the perpendicular line segment from the intersection of beam 21 with the Z-axis to the X-axis, $$\tan\phi = b/(x-a), \text{ and} \quad (5)$$

$$\cos\phi = (x-a)/z. \quad (6)$$

From these relationships, the relationship between z and x may be derived as follows:

Rewriting equation (5) we have $$b = (x-a)\tan\phi \quad (7).$$

Substituting $a = b\tan\Theta$ from equation (4) in equation (7), we have $$b = (x - \tan\Theta)\tan\phi \quad (8).$$

Solving equation (8) for b, we have $$b = x\tan\Theta/(1+\tan\phi\tan\Theta) \quad (9).$$

Solving equation (4) for a, we have $$a = b\tan\Theta \quad (10)$$

Substituting the value of b from equation (9) in equation (10), $$a = x\tan\Theta\tan\phi/(1 + \tan\Theta\tan\phi) \quad (11)$$

Solving equation (6) for z, yields $$z = (x - a)/\cos\phi \quad (12)$$

Substituting the value of a from equation (11) in equation (12), we have $$z = (x/\cos\phi)\left(1 - \frac{\tan\theta\tan\phi}{1 + \tan\theta\tan\phi}\right) \quad (13)$$

Using the relationship $\tan\Theta = x/L$ (equation (1)), and substituting in equation (13) and simplifying, yields $$z = (x/\cos\phi)\left(\frac{1}{1 + (x/L)\tan\phi}\right) \text{ or } z = \frac{a_1 x}{1 + b_1 x} \quad (14)$$

where $a_1 = 1/\cos\phi$ and $b_1 + (1/L)\tan\phi$

Since the voltage $v = kx$ (see equation 3), where k is a constant, $$z = \frac{a_2 v}{1 + b_2 v}, \quad (15)$$

where $a_2$ and $b_2$ are constants.

Differentiating both sides of equation (15) with respect to v and simplifying, we have $$dz/dv = a_2/(1 + b_2 v)^2 \quad (16)$$

Imposing the constraint that the velocity at the point of intersection of the beam with the Z-axis is constant, i.e., $dz/dt = p$ (constant), we can establish the form for the required voltage function v(t).

Since $dz/dt = dz/dv \cdot dv/dt = p$, $$dv/dt = p \cdot dv/dz = p(1 + b_2 v)^2/a_2 \text{ or}$$

$$a_2 dv/p(1 + b_2 v)^2 = dt. \quad (17)$$

Integrating both sides of the equation (17) with respect to t and simplifying, we have $$v(t) = -1/b_2 - a_2/b_2^2 p(t + C), \quad (18)$$

where C is the constant of integration which may be determined by initial conditions imposed on the system. The above equation may be rewritten in the form $$v(t) = -d - e/(t + c), \quad (19)$$

where d and c are constants and e is a nonzero constant.

Scan controller 80 generates a scanning voltage having the above form from a triangle wave form.

In the configuration shown in FIG. 3, there is no constant offset voltage applied to the x-plates 42a and 42b, and the B-axis passes through the center of the target.

Figure 4:
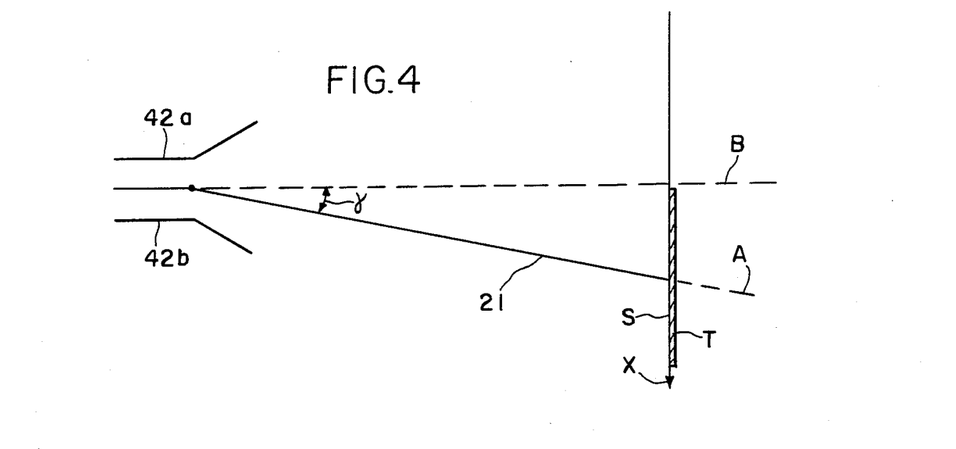
FIG. 4 shows target T displaced along the X-axis so that axis A of the offset beam passes through the center of target, T.

In FIG. 4, a constant offset voltage produces a constant offset angle $\gamma$ and the target T (shown in FIG. 2) is displaced along the x-axis so that the axis A of the offset beam passes through the center of target T. An analysis similar to that given above with respect to FIG. 2 shows that the triangle wave form voltage does not require compensation and is superimposed on the offset voltage in order to produce constant velocity of the intersection of beam 21 along surface S.

Figure 5:
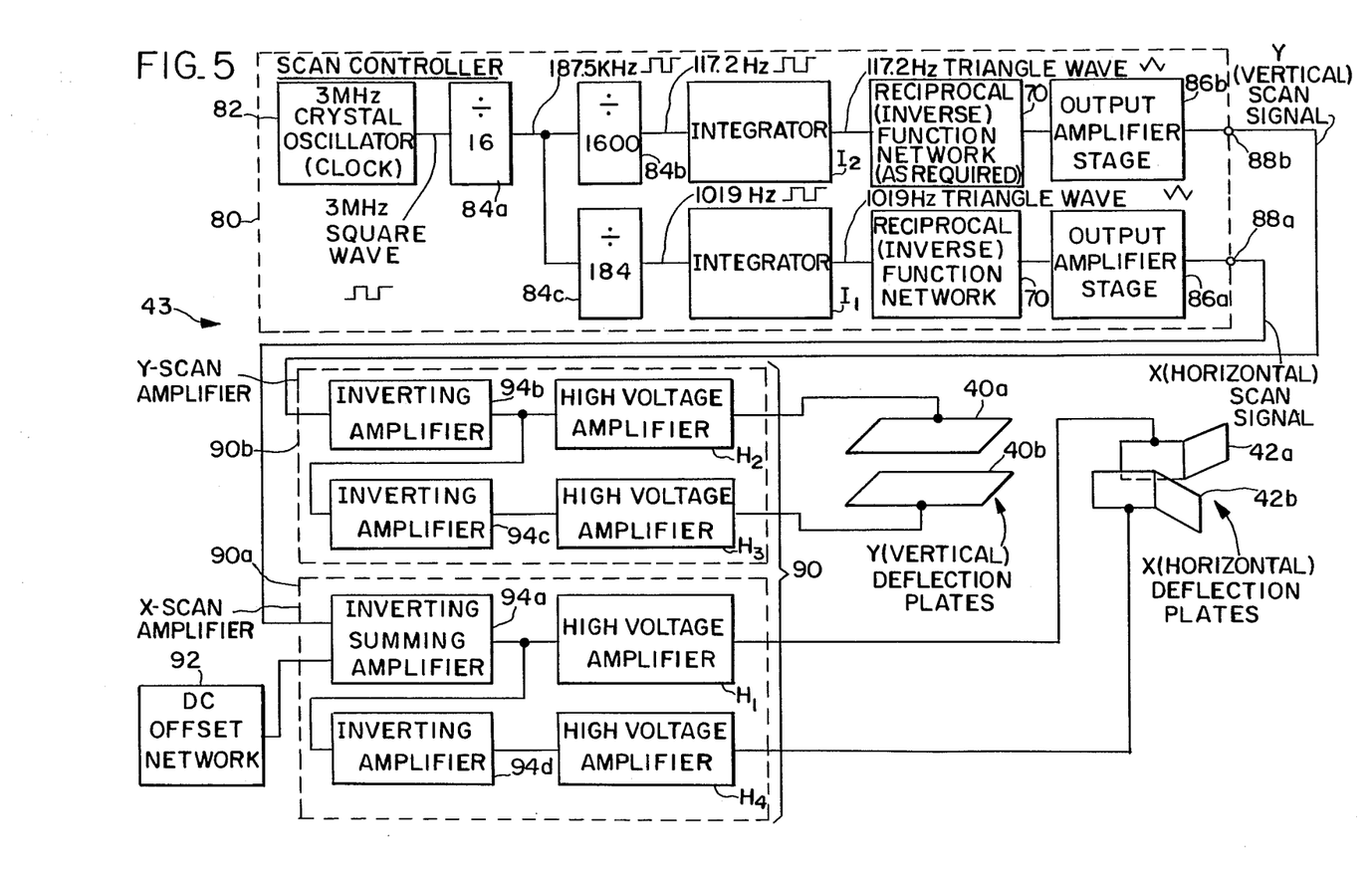
FIG. 5 shows one embodiment of scan control system 43 shown in FIG. 1.

FIG. 5 shows one embodiment of scan control system 43. Scan control system 43 includes scan controller 80, scan amplifier 90 comprising x-scan amplifier 90a and y-scan amplifier 90b and DC offset network 92.

Scan controller 80 includes a 3 MHz crystal oscillator whose square wave output signal is provided to frequency divider 84a, whose 187.5 KHz output signal is provided to frequency dividers 84b and 84c. The 1019 Hz square wave output signal of frequency divider 84c is provided to integrator $I_1$ which generates a 1019 Hz triangle wave which is provided to reciprocal (inverse) function network 70 of the present invention.

Similarly, the 117.2 Hz square wave output signal from frequency divider 84b is provided to integrator $I_2$ which provides a 117.2 Hz triangle wave form to reciprocal (inverse) function network 70. As explained below, reciprocal function generator 70 between integrator $I_2$ and output amplifier 86b is optional, depending on the system configuration. The output signals of reciprocal function generator 70 are provided to output stage amplifiers 86a and 86b which provide the x-scan signal and y-scan signal on output node 88a and 88b respectively.

The x-scan voltage signal on node 88a is supplied to inverting summing amplifier 94a of scan amplifier 90a, where it is summed with the constant DC offset voltage supplied by DC offset network 92 (the offset voltage produces offset angle $\gamma$ (see FIG. 4). The inverted sum of these signals is supplied to inverting amplifier 94d. The output signals of amplifiers 94a and 94d are provided to high voltage amplifiers $H_1$ and $H_4$ respectively and thence to x deflection plates 42a and 42b.

Similarly, the Y-scan voltage on node 88b is provided to inverting amplifier 94b whose output signal is provided to inverting amplifier 94c. The output signals of inverting amplifiers 94b and 94c are supplied to the y-deflection plates 40a and 40b via high voltage amplifiers $H_2$ and $H_3$ respectively.

Figure 6:
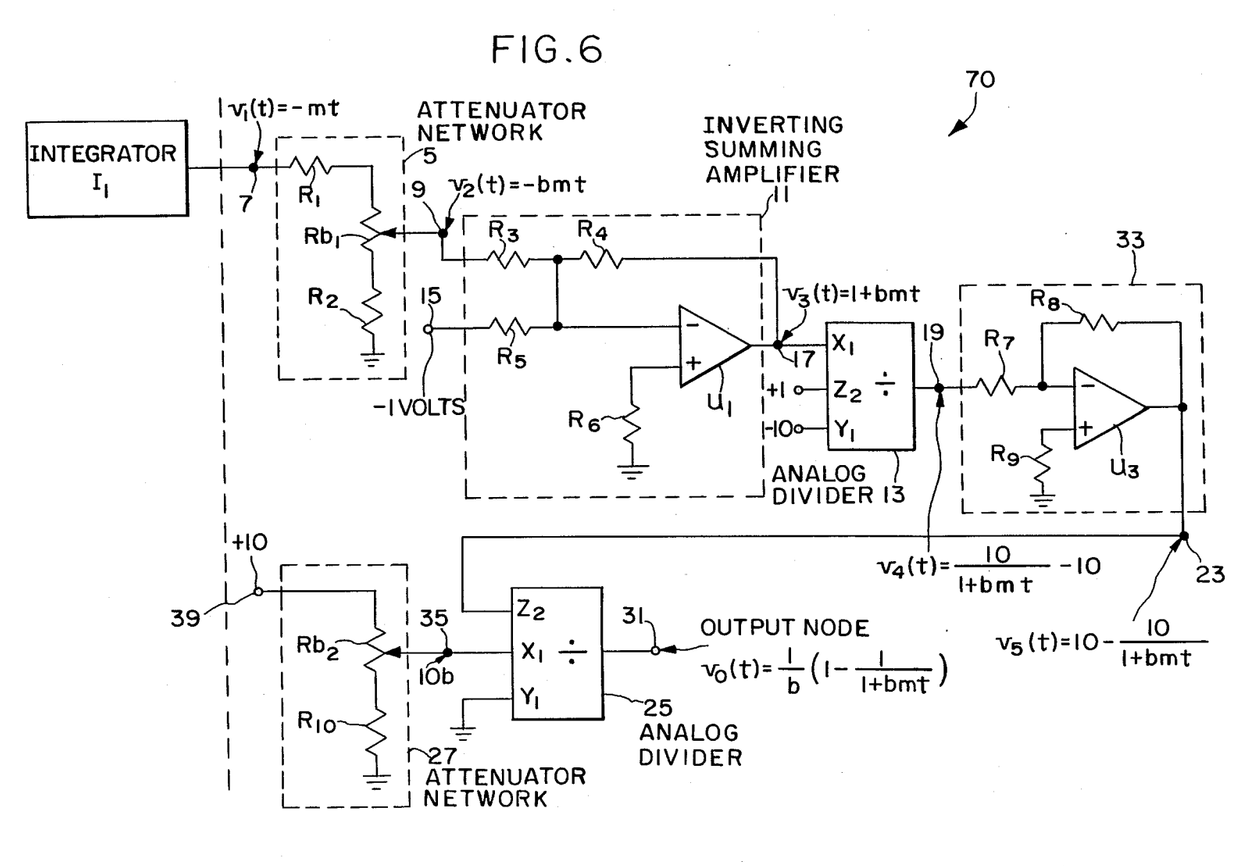
FIG. 6 shows one embodiment of the reciprocal function network of the present invention.

FIG. 6 shows one embodiment of reciprocal function network 70 of the present invention. The output signal from integrator $I_1$ (see FIG. 5) on node 7 has the form $v_1(t) - mt$, where m is a non-zero constant. $v_1$ serves as an input signal to attenuator network 5 which includes resistors $R_1$ and $R_2$ and variable resistor $Rb_{/1}$. The value of $Rb_1$ may be set manually or may be set by a controller (not shown). The output signal $v_2(t)$ of attenuator network 5 is supplied to node 9 and has the form $v_2(t) = -bmt$. The signal on node 9 is supplied to inverting and summing amplifier 11 which includes resistors $R_3$ through $R_6$ and inverting amplifier $u_1$. The resistances of resistors $R_3$, $R_4$ and $R_5$ are equal. A DC of $-1$ volts is supplied to input terminal 15 of amplifier 11. The output signal of amplifier 11 on node 17 has the form $v_3(t) = 1 + bmt$ and is supplied to the $x_1$ input of analog divider 13.

Analog divider 13 may be, for example, analog divider AD534 manufactured by Analog Devices. The transfer function of analog divider 13 is defined by the equation $$v_{out} = SF\left(\frac{z_2 - z_1}{x_1 - x_2}\right) + y_1,$$

where SF is a scale factor which is equal to 10. Terminal $x_2$ is grounded (at 0 volts) and so is not shown in FIG. 6. As shown in FIG. 6, constant voltages of $+1$ volt and $-10$ volts are supplied to the $z_2$ and $Y_1$ inputs respectively of analog divider 13. Hence, the output voltage of analog divider 13 on node 19 is given by $v_4(t) = 10/(1 + bmt) - 10$. The signal on node 19 is supplied to inverting amplifier network 33 which includes resistors $R_7$ and $R_9$ and feedback resistor $R_8$ connected between the output of amplifier $u_3$ and the inverting input terminal of amplifier $u_3$. The output signal of inverting amplifier network 33 on node 23 has the form $v_5(t) = 10 - 10/(1 + bmt)$. This latter signal serves as the z2 input of analog divider 25 which may be part AD534 previously referenced. A variable voltage $10b$ is supplied to the x1 input of analog divider 25 and the $Y_1$ input is grounded.

The variable voltage $10b$ is supplied by attenuator network 27 which includes variable resistor $R_{b2}$ and resistor $R_{10}$. A DC voltage of $+10$ volts is supplied to input node 39 of attenuator network 27.

It follows that the output voltage $$v_0(t) = \frac{1}{b}\left(1 - \frac{1}{1 + bmt}\right)$$

Note that when $t = 0$, $v_0(t) = 0$.

In the above analysis, it was assumed that the output signal of integrator I1 has the form $v_1(t) = -mt$. When the output signal of the triangle function generator has the form $+mt$, the output voltage is given by $$v_0(t) = \frac{1}{b}\left(1 - \frac{1}{1 - bmt}\right)$$

In either case, the output voltage has the form $$v(t) = -d - \frac{e}{(t + c)},$$

the form required by equation (19).

While the reciprocal function network shown in FIG. 6 provides an exact solution (based on the above analytic model) to the problem of generating an x-scan voltage which causes the velocity of the point of intersection of the scan beam and the Z-axis to be constant, other embodiments of the invention may serve to approximate the exact solution.

Since the expression for v(t) in equation (19) can be expanded into a power series, it follows that the solution can be approximated using a function network 70' whose output signal is a polynomial which approximates the expression for v(t) in equation (19).

Figure 7:
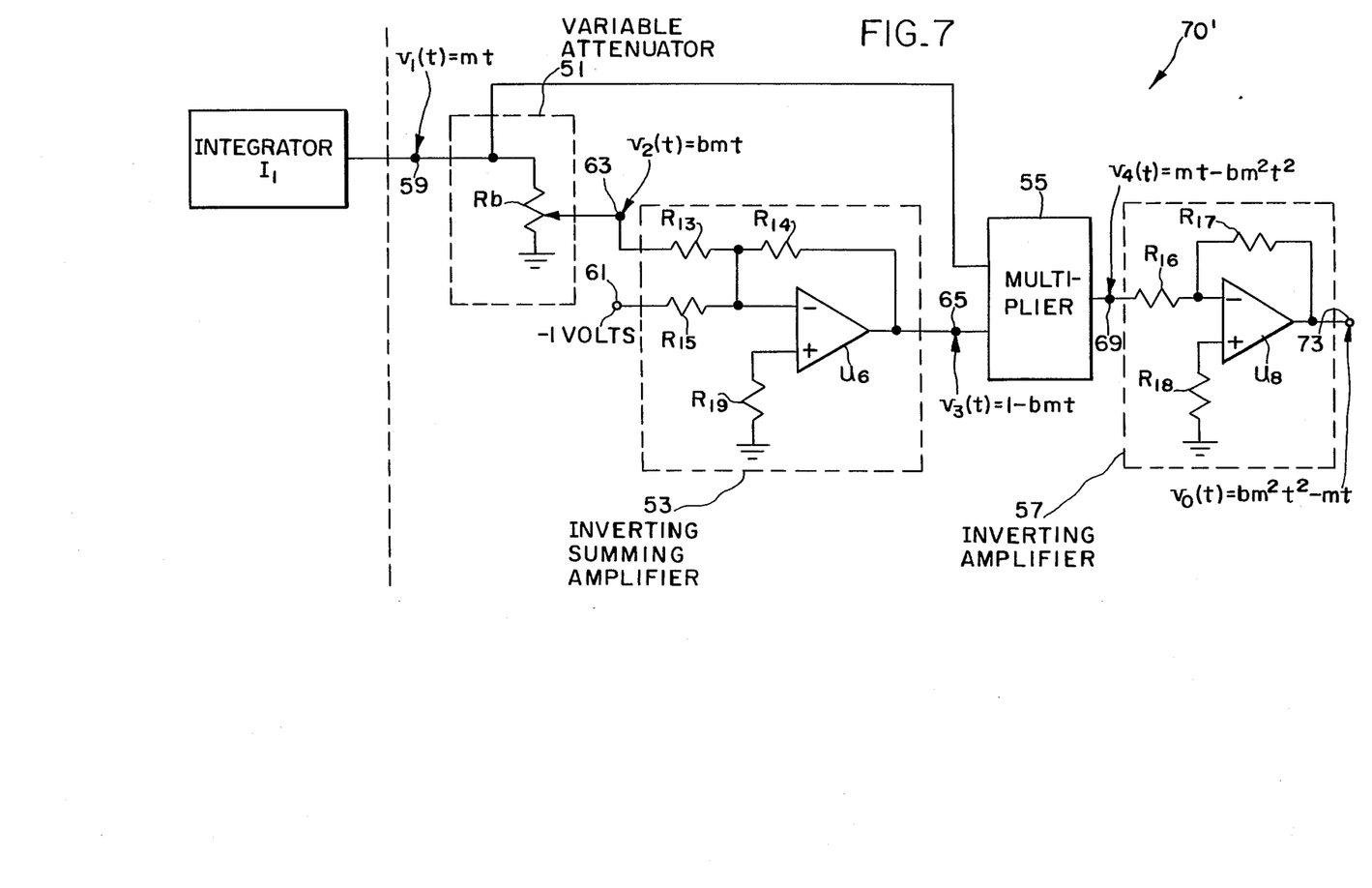
FIG. 7 shows an approximation circuit for generating a polynomial function which approximates the output signal of the reciprocal function network shown in FIG. 6.

The simplest approximation circuit using a polynomial function generator 70' is provided by the embodiment shown in FIG. 7. In FIG. 7 Integrator I1 (FIG. 5) provides a triangle wave form on node 59 of the form $v_1(t) = mt$ where m is a non-zero constant. This wave form is supplied to variable attenuator 51 which includes variable resistor $R_b$. The output voltage on node 63 has the form $v_2(t)$ bmt and is supplied to inverting summing amplifier 53 which includes amplifier $u_6$, resistor $R_{19}$, and resistors $R_{13}$, $R_{14}$ and $R_{15}$ which have equal values. The output signal of amplifier 53 on node 65 has the form $v_3(t) = 1 - bmt$. This signal, along with the triangle wave form output signal of integrator I1, is supplied to multiplier 55. Multiplier 55 provides an output signal on node 69 of the form $v_4(t) = mt - bm^2t^2$. This latter signal is supplied to inverting amplifier 57 which includes resistors $R_{16}$, $R_{17}$, and $R_{18}$ and amplifier $U_8$. The output voltage of amplifier 57 on node 73 has the form $v0(t) = bm^2t^2 - mt$. The coefficient of the second order term is thus determined by and is proportional to attenuator setting $R_b$. The coefficient b is then adjusted so that the polynomial $v_0(t)$ approximates the reciprocal function of equation (19). If desired, the coefficient may be adjusted empirically to provide partial compensation for second order nonuniformities of dopant distribution.

Figure 8:
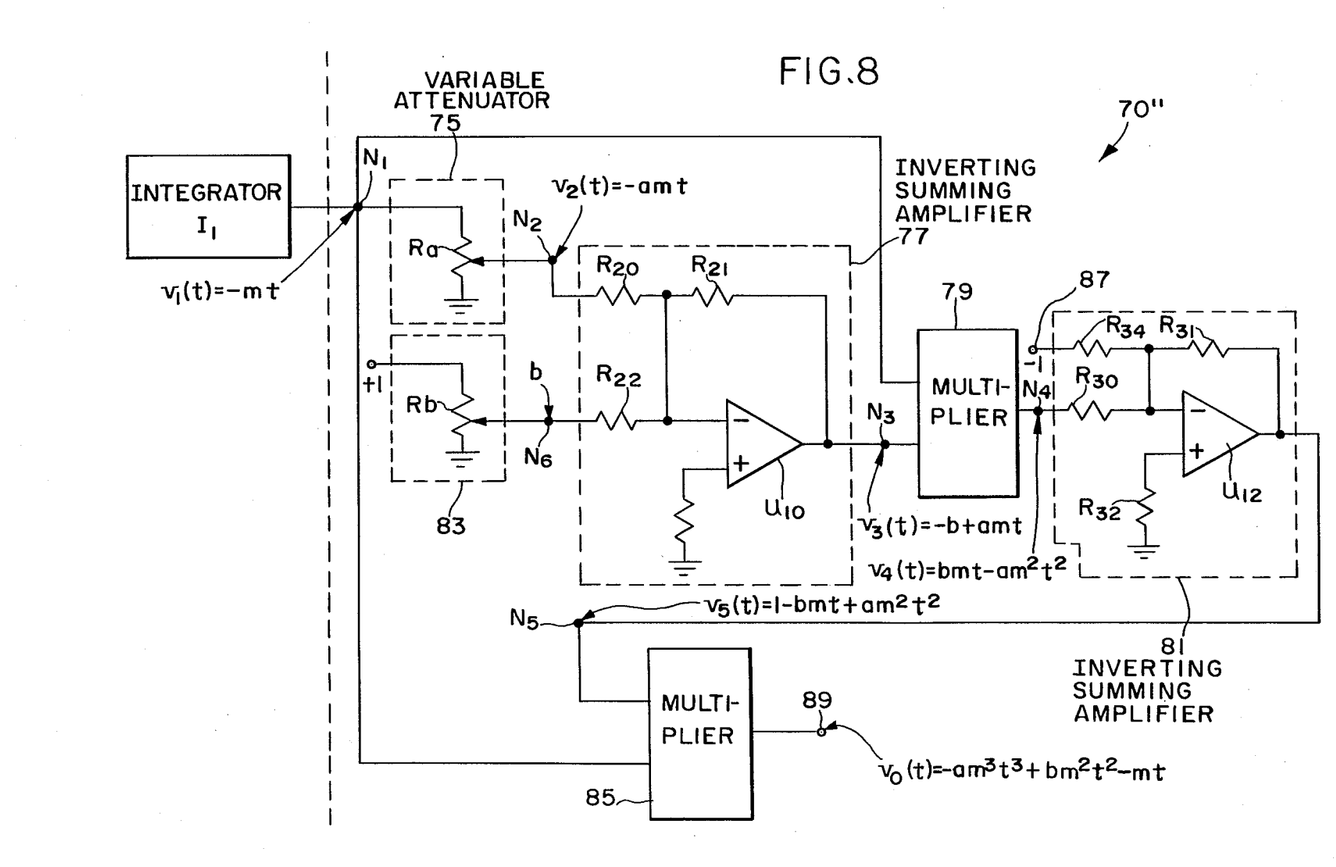
FIG. 8 shows an approximation circuit whose output signal provides a cubic approximation to the reciprocal function generator shown in FIG. 6.

A wave form generator which provides a cubic approximation is provided by the circuit 70'' shown in FIG. 8. In the circuit shown in FIG. 8, the output signal of triangle wave form generator I1, $v_1(t) = -mt$ (where m is a non-zero constant), is provided on node $N_1$ to variable attenuator 75 which includes variable resistor $R_a$. The output signal of attenuator 75 on the node $N_2$ has the form $v_2(t) = -amt$. The signal on node $N_2$ serves as one input to inverting summing amplifier 77, which includes amplifier $U_{10}$ and resistors $R_{20}$, $R_{21}$ and $R_{22}$ of equal value. Variable attenuator network 83 which includes variable resistor $R_b$, supplies the voltage b on node $N_6$ to inverting summing amplifier 77. The output of amplifier 77 on node $N_3$ has the form $v_3(t) = -b + amt$ and serves as one input to multiplier 79. The other input to multiplier 79 is the output signal of Integrator I1. The output signal of multiplier 79 on node $N_4$ thus has the form $v_4(t) = bmt - am^2t^2$. signal on node $N_4$ is provided to inverting summing amplifier 81 which also receives the DC voltage $-1$ volt on input node 87. Inverting summing amplifier 81 includes resistors $R_{30}$, $R_{32}$, $R_{34}$, amplifier $u_{12}$ and feedback resistor $R_{31}$. The output signal of amplifier 81 has the form $v_5(t) = 1 - bmt + am^2t^2$. This latter signal is provided to multiplier 85 along with the output signal of Integrator I1.

The output signal of multiplier 85 on node 89 has the form $v_0(t) = am^3t^3 + bm^2t^2 - mt$. Note that the variable attenuators 75 and 83 independently control the coefficients of the second and third order terms of the output signal. The coefficients are proportional to the attenuator settings $R_a$ and $R_b$. These coefficients may be adjusted so that the cubic polynomial in mt approximates the function of equation (19).

If desired, circuits generating higher order polynomial approximations may also be employed.

Since the target shown in FIGS. 3 and 4 is not tilted by rotating the target about the X-axis, there is no need to compensate the y-scan triangle wave form from integrator I2. In this event, the output of integrator I2 is supplied directly to output amplifier stage $86b$. A combination of a triangular voltage wave form applied to the y-scan plates and the wave form generated by the embodiment of FIG. 6 applied to the x-scan plates results in the velocity of the point of intersection of the scan beam along the planar surface of target S being constant where the target S is tilted by the rotation about the Y-axis as shown in FIG. 3.

If target T shown in FIG. 2 is tilted by rotating it from the position normal to the beam axis B shown in FIG. 2 about the X-axis by an angle $\zeta$, (not shown) then the reciprocal function generator of FIG. 6 is used for the y-scan plates, and no compensation is required for the triangle wave form applied to the x-scan plates and the resulting wave forms driving the scan plates produce a constant velocity of the point of intersection of the beam along the planar surface of the target S as so tilted.

If the target T of FIG. 3 is rotated about the Z-axis by the fixed angle $\zeta$ (not shown), then the reciprocal scan generator 70 of FIG. 6 is employed for both the x-scan plates and the y-scan plates in order to achieve a constant velocity of the point of intersection of the scanned beam on the two dimensional surface S of target T.

The compensation circuits 70, 70', and 70'' may also be employed in all the configurations previously discussed with the settings of the variable attenuators and the polarity of the compensated wave form determined empirically to yield improved uniformity of implant dosage, permitting compensation for nonuniformities which are difficult to quantify analytically.

The above embodiments are meant to be descriptive and not limiting and many substitutions will be clear to one of average skill in the art in view of the above disclosure.

I claim:

1. An apparatus for scanning an ion beam comprising:
   means for generating a voltage signal having a triangle wave form;
   means for deriving from said voltage signal a first scan voltage signal v(t) having the form $$v(t) = -d - e/(t+c)$$

where d and c are constants and e is a non-zero constant; and
   means for supplying said scan voltage to a first pair of electrodes for deflecting said ion beam.

2. An apparatus for scanning an ion beam comprising:
   means for generating a voltage signal s(t) having a triangle wave form;
   means for deriving from said voltage signal a scan voltage signal which is a polynomial of degree 2 in s(t) of the form $a_0 + a_1 s(t) + a_2(s(t)^2)$; and
   means for applying said scan voltage signal to a first pair of electrodes for deflecting said ion beam.

3. An apparatus for scanning an ion beam comprising:
   means for generating a voltage signal s(t) having a triangle wave form;
   means for deriving from said voltage signal a scan voltage signal which is a polynomial of degree N in s(t) of the form $a_0 + a_1 s(t) + \ldots + a_N(s(t)^N)$ wherein N is a positive integer $\geq 2$;
   means for adjusting the amplitude of each of said coefficients of said polynomial independently of the adjustment of any other of said coefficients of said polynomial;
   means for supplying said scan voltage to a first pair of electrodes for deflecting said ion beam.

4. An apparatus as in claim 1 further including:
   means for deriving from said voltage signal a second scan voltage signal having the form $$v_2(t) = -d_2 - e_2/(t+c_2)$$

where $d_2$ and $c_2$ are constants and $e_2$ is a non-zero constant; and
   means for applying said second scan voltage to a second pair of electrodes for deflecting said ion beam, the electric field generated by said first pair of electrodes being perpendicular to the electric field generated by said second pair of electrodes.

5. An apparatus as in claim 1 wherein said means for deriving comprises an analog divider.

6. A method for scanning an ion beam comprising:
   generating a voltage signal having a triangle wave form;
   deriving from said voltage signal a scan voltage signal having a form $v(t) = -d - e/(t+c)$, where d and c are constants and e is a non-zero constant; and
   supplying said scan voltage to a first pair of electrodes for deflecting said ion beam.

7. A method for scanning an ion beam comprising:
   generating a voltage signal s(t) having a triangle wave form;
   deriving from said voltage signal a scan voltage signal which is a polynomial of degree N in s(t) of the form $a_0 + a_1 s(t) + \ldots + a_N(s(t)^N)$;
   adjusting said coefficients of said polynomial in order to approximate a function of the form $$v(t) = -d - e/(t+c); \text{ and}$$

applying said scan voltage to a first pair of electrodes for deflecting said ion beam.

* * * * *